United States Patent [19]

Morrison et al.

[11] Patent Number: 4,612,072
[45] Date of Patent: Sep. 16, 1986

[54] METHOD FOR GROWING LOW DEFECT, HIGH PURITY CRYSTALLINE LAYERS UTILIZING LATERAL OVERGROWTH OF A PATTERNED MASK

[75] Inventors: Andrew D. Morrison, Altadena; Taher Daud, LaCrescenta, both of Calif.

[73] Assignee: The United States of America as represented by the Administrator of the National Aeronautics and Space Administration, Washington, D.C.

[21] Appl. No.: 706,564

[22] Filed: Feb. 28, 1985

Related U.S. Application Data

[62] Division of Ser. No. 507,624, Jun. 24, 1983, Pat. No. 4,522,661.

[51] Int. Cl.⁴ .................... H01L 21/20; H01L 21/76
[52] U.S. Cl. .................... 148/175; 29/576 E; 29/576 J; 29/576 W; 29/575; 29/578; 148/174; 148/DIG. 26; 148/DIG. 85; 148/DIG. 150; 156/612; 156/DIG. 65; 156/DIG. 88; 357/4; 357/50
[58] Field of Search ............ 29/576 E, 576 W, 576 J, 29/578, 575; 148/174, 175, DIG. 26, DIG. 85, DIG. 150; 156/612, DIG. 65, DIG. 88, 357/4, 50

[56] References Cited

U.S. PATENT DOCUMENTS

| | | | |
|---|---|---|---|
| 3,564,358 | 2/1971 | Hähnlein | 148/DIG. 150 |
| 3,634,150 | 1/1972 | Horn | 148/175 |
| 4,378,629 | 4/1983 | Bozler et al. | 29/578 X |
| 4,482,422 | 11/1984 | McGinn | 156/612 |

OTHER PUBLICATIONS

Tausch et al., "Novel Crystal Growth ... Overgrowth Onto Silicon Dioxide", J. Electrochem. Soc., vol. 112, No. 7, Jul. 1965, pp. 706–709.

*Primary Examiner*—William G. Saba
*Attorney, Agent, or Firm*—Paul F. McCaul; Thomas H. Jones; John R. Manning

[57] ABSTRACT

The purity and perfection of a semiconductor is improved by depositing a patterned mask (12) of a material impervious to impurities of the semiconductor on a surface (14) of a blank (10). When a layer (40) of semiconductor is grown on the mask, the semiconductor will first grow from the surface portions exposed by the openings (16) in the mask (12) and will bridge the connecting portions of the mask to form a continuous layer (40) having improved purity, since only the portions (42) overlying the openings (16) are exposed to defects and impurities. The process can be reiterated and the mask translated to further improve the quality of grown layers.

7 Claims, 6 Drawing Figures

METHOD FOR GROWING LOW DEFECT, HIGH PURITY CRYSTALLINE LAYERS UTILIZING LATERAL OVERGROWTH OF A PATTERNED MASK

ORIGIN OF THE INVENTION

The invention described herein was made in the performance of work under a NASA contract and is subject to the provisions of Section 305 of the National Aeronautics and Space Act of 1958, Public Law 83-568 (72 Stat 435; 42 USC 2457).

This is a division of application Ser. No. 507,624, filed June 24, 1983, now U.S. Pat. No. 4,522,661.

TECHNICAL FIELD

The present invention relates to techniques for growing low defect, high purity layers of semiconductors and, more particularly, to the growth of low defect, high purity silicon on high defect, impure silicon substrates.

BACKGROUND ART

Self-sufficiency in energy is a stated national goal. Many of the proposed means to achieve this goal, especially those dependent on fossil fuels, are either environmentally unacceptable or not feasible.

Of the available alternatives, solar energy is the most abundant, inexhaustible single resource available. However, capturing and utilizing solar energy is not simple. Methods are being sought to convert solar energy to a concentrated, storable form of energy.

One method of converting solar energy to a usable form being prominently considered is the deployment of large arrays of photovoltaic solar cells, especially in the sunbelt areas such as the southwestern and western regions of the United States. The most promising candidate for the solar cell is a doped silicon material.

Silicon is one of the most plentiful elements in the earth's crust. However, solar cells are presently fabricated from semiconductor-grade silicon, which has a market price of about $65.00 per kilogram. A number of current projects are directed to developing the national capability to produce low-cost, long-life photovoltaic modules at a rate greater than 500 MW per year and at a price of less than $500 per peak kilowatt by the year 1986. A drastic reduction in price of material is necessary to meet these important national objectives. The presence of transition metal impurities has been identified as one of the major factors causing degradation of silicon photovoltaic cells. These impurities have a negative effect on the carrier lifetime and also on the efficiency of silicon cells. Both of these factors have been considered as inter-related critical limitations. The minimization of all transition-metal impurities is a major concern in the production of silicon for wide-spread use in solar arrays.

High quality surfaces of crystalline materials absent defects such as dislocations are required for growing layers which are to be fabricated into electronic devices having optimum performance. Device performance usually depends upon the degree of perfection of the substrate material on which the device is fabricated, because a growing film typically contains all the defects of the substrate from which it grows. This has required the use of expensive substrates of high perfection. Many attempts to produce highly perfect films on imperfect substrates in order to reduce the cost of good devices have been made, but without substantial success.

Growing of films on solid state substrates has been practiced as a means of forming junctions, or for salvaging the substrate. Baliga et al. (U.S. Pat. No. 4,251,299) in FIG. 5 shows non-planar growth of silicon extending beyond etched areas to form a continuous film. However, Baliga et al. use liquid phase epitaxial growth and only want growth to occur in the etched grooves.

There are several references that teach the salvaging of imperfect semiconductor or doped semiconductor blanks. Endler et al. (U.S. Pat. No. 4,255,206) does grow a film extending into and bridging bevels on mesas. However, he only uses a mask to etch the bevels. There is no mask present during liquid or vapor deposition. Mayberry et al. (U.S. Pat. No. 3,559,281) reclaims wafers by stripping the front surface, passivating it and then stripping and polishing the opposite surface and conducting crystal growth thereon.

Barnett et al. (U.S. Pat. No. 3,647,578), Fujii (U.S. Pat. No. 3,671,338), and Revesz et al. (U.S. Pat. No. 3,904,453) do grow crystals on a perforated, masked substrate but they restrict growth to the window openings. Lawrence (U.S. Pat. No. 3,923,567) reclaims crystals by gettering to concentrate defects at the surface. Rode (U.S. Pat. No. 4,050,964) improves smoothness of growth by misorienting the substrate. Lawrence et al. (U.S. Pat. No. 4,062,102) processes reject wafers by stripping and etching to form a pattern for electrodes. MacDonald, Jr. et al. (U.S. Pat. No. 4,131,472) tracks the defects to dies of a mask so as to correct the die openings. Baliga (U.S. Pat. No. 4,128,440) lowers the temperature to control diffusion. Esseluhn (U.S. Pat. No. 4,160,682) shows an improved slider apparatus. Kotval el at. (U.S. Pat. No. 4,124,410) directionally pulls relatively impure silicon to form low cost, single crystal silicon and Mizrah (U.S. Pat. No. 4,199,379) selectively forms a metal pattern on a crystal by deposition, masking and etching.

SUMMARY OF THE INVENTION

Because a growing film typically contains all the defects of the substrate from which it grows, the obvious solution is to have the film grow from a substrate with limited defects. However, low defect substrates are expensive. The process of the invention produces high quality, low-defect films or layers on low-quality, inexpensive substrates using well established vapor deposition, epitaxial growth techniques.

This is accomplished in accordance with the invention by masking most of the surface of the substrate with a mask having windows exposing a portion of the surface, generally 50% to 95% thereof. The mask is impervious to diffusion of impurities in the substrate. Epitaxial vapor deposition onto the masked substrate results in film nucleation growing only in the windows bridging the land area of the mask and forming a continuous film which completely covers the surface of the substrate.

The number of defects visible to the observer of this masked surface and available to the growing film is reduced to the number of defects in the windows, all other defects are masked. Growth of a crystalline layer on this new surface, if nucleated in the windows, will contain only the number of defects which are present in the windows and defects occurring at the boundaries of the growing film as the film which originated at each window begins to coalesce. Every reiteration of the masking and growth from the vapor will result in a further decrease in the number of defects in the surface film. Additionally, the masking will inhibit the diffusion of impurities in the imperfect substrate into the growing films. Each reiteration will result in a more perfect film and thicker, more perfect films can be grown with each reiteration.

The substrate can be single crystal or polycrystalline and can be a semiconductor material other than silicon, such as germanium or the wider band gap materials, such as III-IV compounds, suitably gallium arsenide or phosphide. A suitable masking material for silicon is silicon oxide which also can be deposited from the vapor phase. The silicon oxide film is then etched to form an array of windows exposing the underlying substrate surface. Silicon films are then deposited on the mask, nucleate only in the windows, and grow to form a layer which completely covers the low-quality, low-cost substrate.

The mask has the added advantage of acting as a diffusion barrier to limit the diffusion of impurities from a less pure substrate into the purer, grown layer. Reiterations of the masking and the growth process will insure increasingly more perfect layers. This can be an automated and an inexpensive process. The equipment necessary to produce the masks and do the epitaxial growth is available in the market place from a variety of sources. The process itself is extremely simple and relatively low-cost.

These and many other features and attendant advantages of the invention will become apparent as the invention becomes better understood by reference to the following detailed description when considered in conjunction with the accompanying drawings.

DESCRIPTION OF THE PREFERRED EMBODIMENTS

Figure 1:
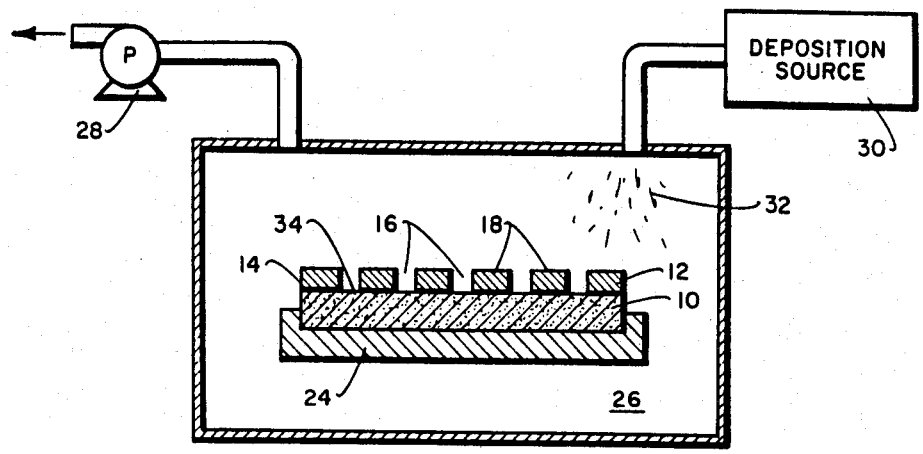
FIG. 1 is a schematic view of a deposition apparatus.
Figures 2, 3:
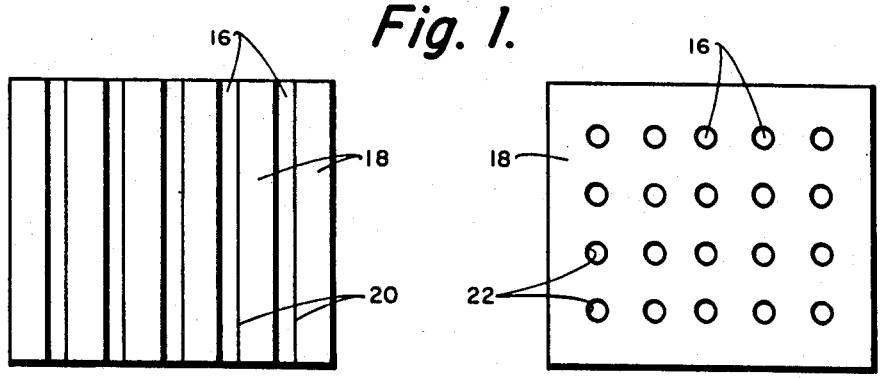
FIG. 2 is a top view of a mask applied to a semiconductor blank.
FIG. 3 is a top view of another type of mask applied to a seimconductor blank.

Referring now to FIGS. 1 and 2, the process of the invention utilizes a low cost, relatively impure blank 10 of semiconductor. The mask 12 of an impurity-impervious material is applied to a surface 14 of the blank. The mask has openings 16 separated by bridges 18 of the mask material. The openings 16 can be in the form of lines 20 in the gradient-like mask shown in FIG. 2, or the openings can be in the form of polygons or circles 22, as shown in FIG. 3.

The pattern can be applied by applying a continuous layer across the surface 14 and then selectively removing material for the openings by photolithography and etching. The pattern of the mask could also be applied by deposition through a stencil onto the surface, such as a sheet of metal containing a pattern of openings. A layer of semiconductor is then deposited on the surface of the blank by any suitable means, such as by vapor or liquid epitaxial deposition techniques according to procedures well known in the art. Vapor deposition is preferred with silicon.

Figure 4:
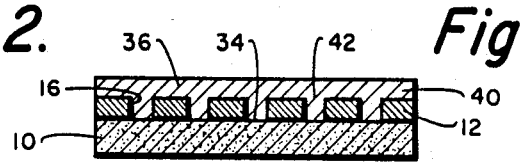
FIG. 4 is a side view of the coated blank.

A blank 10 with patterned mask 12 is then placed in the holder 24 within a deposition chamber 26. The chamber is evacuated by vacuum pump 28. Deposition source 30 is then activated to feed vapors 32 into the chamber. The deposition chamber may be provided with appropriate heating means. As shown in FIG. 4 the vapors react at or near the surface to deposit crystalline semiconductor material which deposits at the surface portions 34 within the openings 16. The deposit grows to form a layer which fills the openings 16 and forms a connecting portion 36 to the next opening until a continuous layer 40 is formed. The layer 40 will have reduced defects throughout, but will have less impurities and defects within the connecting portions 36, than the portions 42 overlying the openings 16.

The coated blank is then removed and a device can be formed on the layers by doping to form a junction and applying electrodes. The front surface may be polished to remove non-planar portions and the grown layer can be sliced from the blank.

Figure 5:
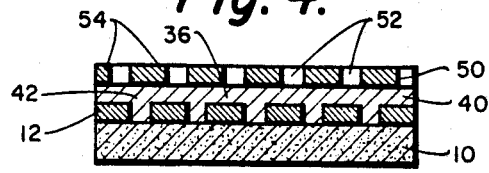
FIG. 5 is a side view of a further mask applied to the grown layer.
Figure 6:
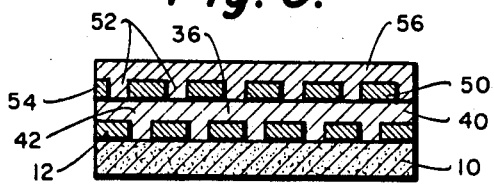
FIG. 6 is a side view of the blank showing two grown layers of semiconductor according to the invention.

A further enhancement of growth of more perfect and pure crystals can be achieved by reiteration steps in which the mask is displaced, so that solid portions overlay the open areas of the previous mask. Referring now to FIGS. 5 and 6, the coated blank with grown layer 40 is then covered with a mask 50 having openings 52 overlying the portions 36 and having bridges 54 covering the portions 42. Vapor deposition results in growth of a layer 56 which has fewer defects than if only mask 12 had been utilized. This process can be repeated as many times as necessary to produce the desired quality of semi-conductor.

All the materials, apparatus and procedures necessary to practice the invention are available. A suitable procedure follows. A silicon blank, such as a material prepared by pulling ribbon or rod from a melt, is sliced, polished and placed in a deposition chamber. A layer of silicon dioxide having a thickness of at least 2000 Angstroms to 10,000 Angstroms, usually from 6000 to 10,000 Angstroms, is grown on the surface by feeding oxygen into the chamber. A layer of appropriate photoresist material is then applied and dried. The layer of photoresist is exposed through a mask, developed, rinsed and cured. The photoresist can be a positive or negative photoresist. The uncured areas are removed with solvent to expose portions of the silicon oxide layer. The layer is etched with a mixture of 10% hydrofluoric acid, or other suitable solvent to expose portions of the silicon surface. The remaining portions of the photoresist are removed with suitable solvent, such as sulfuric acid-hydrogen peroxide. The silicon oxide masked blank is then placed in a deposition apparatus and a silicon layer is grown by epitaxial growth process and proceeds from the openings and across the bridging portions of the silicon dioxide mask to form a continuous layer with less defects and fewer impurities.

It is to be understood that only preferred embodiments of the invention have been described and that numerous substitutions, modifications and alterations are permissible without departing from the spirit and scope of the invention as defined in the following claims.

We claim:
1. A method of forming an improved semiconductor comprising the steps of:
applying to a surface of a semiconductor a layer of a first mask having a pattern of openings exposing portions of the surface, said mask being impervious to diffusion of impurities from said surface;

growing a first continuous layer of semiconductor on said surface extending from exposed portions and bridging the connecting portions of the mask to form a continuous layer;

applying to a surface of said first layer of semiconductor a second mask having a pattern of openings in registration with the bridges between the openings of the first mask and a pattern of bridges overlying the openings in the first mask, and growing a second continuous layer of semiconductor on said first layer with the second layer extending from the openings in the second mask over the bridges of the second mask.

2. A method according to claim 1 in which the first mask has openings 50% to 95% of the area of the semiconductor surface.

3. A method according to claim 2 in which the first and/or second mask pattern is deposited directly on the surface by shadow masking.

4. A method according to claim 2 in which the surface is covered with a continuous layer of the first and/or second mask and portions of the mask layer are selectively removed to form said pattern using photolithography.

5. A method according to claim 4 in which the portions are removed by etching.

6. A method according to claim 1 in which the semiconductor is silicon.

7. A method according to claim 6 in which the first and/or second mask is silcon dioxide.

* * * * *